Aug. 24, 1965 D. J. SIKORRA 3,202,807

MULTIPLICATION BY VARYING AMPLITUDE AND PERIOD OF OUTPUT PULSE

Filed June 19, 1961 2 Sheets-Sheet 1

FIG. I

INVENTOR.
DANIEL J. SIKORRA
BY Roger W. Jensen
ATTORNEY

MULTIPLICATION BY VARYING AMPLITUDE AND PERIOD OF OUTPUT PULSE

Filed June 19, 1961

INVENTOR.
DANIEL J. SIKORRA
BY Roger W. Jensen
ATTORNEY

United States Patent Office 3,202,807
Patented Aug. 24, 1965

3,202,807
MULTIPLICATION BY VARYING AMPLITUDE AND PERIOD OF OUTPUT PULSE
Daniel J. Sikorra, Champlin, Minn., assignor to Honeywell Inc., a corporation of Delaware
Filed June 19, 1961, Ser. No. 118,117
5 Claims. (Cl. 235—194)

This invention relates to improvements in control apparatus and more particularly to multiplier circuits wherein the period of the output signal is controlled by a first input signal and the magnitude of the output signal is controlled by a second output signal.

The invention comprises a pulse generator which produces an alternating rectangular wave output. The time length of the positive and negative portions of the output wave form are variable in response to a first input signal.

Connected to the output of the pulse generator are two gates; the first gate connected to conduct when the output of the generator is of a first polarity and the second gate connected to conduct when the output of the generator is of a second polarity. In other words, the pulse generator output controls the conduction time of each of the gates.

A second input signal is connected in circuit with each of the gates, and this signal controls the magnitude of conduction of each gate.

Since gate percent conduction time is determined by the first input signal and gate conduction magnitude is determined by the second input signal, the output signal developed by the gate conduction will be proportional to the product of the two input signals.

Prior art multipliers of this general type usually have the disadvantage of being only one or two quadrant multipliers. In other words, the multiplier or the multiplicand signals, or perhaps both, are limited to a particular polarity of signal. Prior are circuits generally have the further disadvantage of being transformer coupled between the pulse generator and the gates. Transformer coupling in these circuits normally decreases the multipliers range of operation.

The present invention, on the other hand, is a four quadrant, or full, multiplier, and uses direct coupling between the pulse generator and gates. By a four quadrant multiplier is meant that the multiplier and multiplicand signals may be either positive or negative and that the product of these signals will also have the correct algebraic sign.

It is one object of this invention, therefore to provide a four quadrant multiplier circuit wherein a gate circuit is controlled by a variable pulse generator.

Another object of this invention is to provide a multiplier circuit wherein a gate circuit is directly coupled to the output of a variable pulse width pulse generator.

Figure 1:
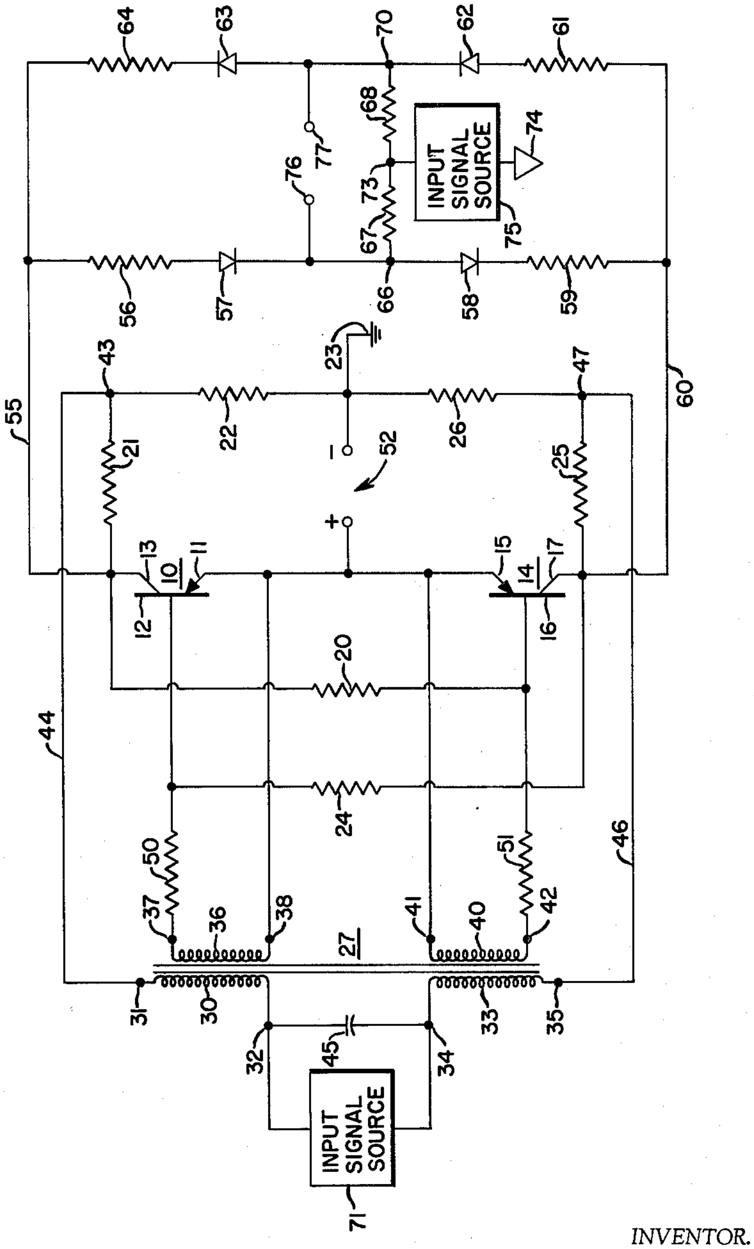
Figures 2, 3, 4A, 4B:
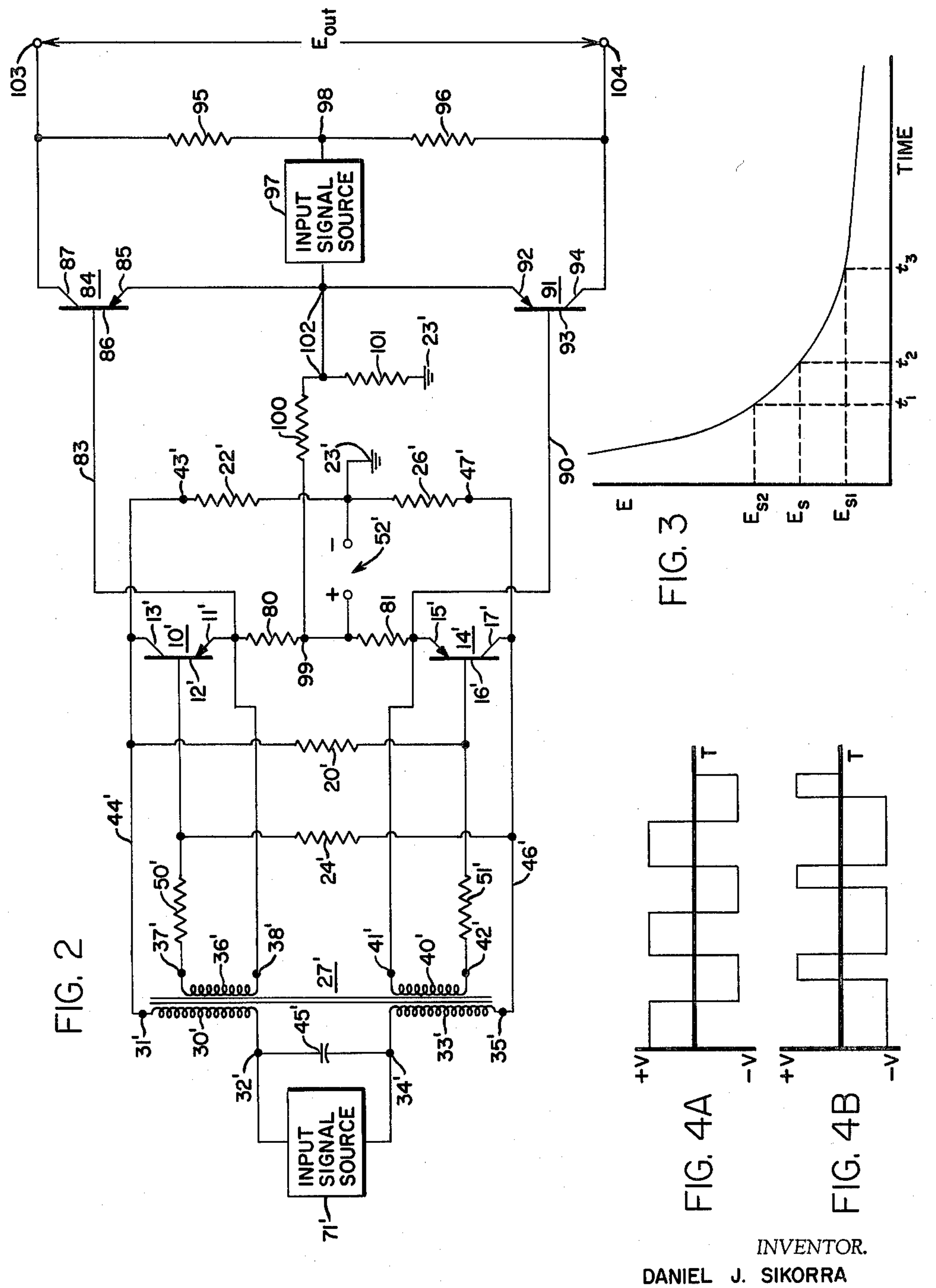

These and other objects of my invention will become apparent to those skilled in the art upon consideration of the accompanying specification, claims and drawings of which FIGURE 1 is a schematic diagram of one embodiment of this invention; FIGURE 2 is a schematic diagram of another embodiment of this invention; FIGURE 3 illustrates the effect of the control signal on the volt-time characteristic of the saturable transformer; FIGURE 4A illustrates the oscillator output in the absence of a control signal; and FIGURE 4B illustrates the oscillator output when a control signal is applied.

*Structure of FIGURE 1*

Referring to FIGURE 1 there is shown a transistor 10 having an emitter 11, a base 12 and a collector 13. Emitter 11 of transistor 10 is directly connected to an emitter 15 of a transistor 14. Transistor 14 further has a base 16 and a collector 17. Collector 13 of transistor 10 is connected by means of a resistor 20 to the base 16 of transistor 14, and by means of a resistor 21 in series with a resistor 22 to a common conductor, in this case power supply ground 23. Collector 17 of transistor 14 is connected by means of a resistor 24 to the base 12 of transistor 10, and by means of a resistor 25 in series with a resistor 26 to power supply ground 23.

A saturable transformer 27 has a first winding 30 having end terminals 31 and 32, a second winding 33 having end terminals 34 and 35, a third winding 36 having end terminals 37 and 38, and a fourth winding 40 having end terminals 41 and 42.

A junction 43 between resistors 21 and 22 is serially connected by means of a conductor 44, transformer winding 30, a capacitor 45, transformer winding 33, and a conductor 46 to a junction 47 between resistors 25 and 26. Base 12 of transistor 10 is connected by means of a resistor 50 in series with transformer winding 36 to the emitter 11 of transistor 10. Base 16 of transistor 14 is connected by means of a resistor 51 in series with transformer winding 40 to the emitter 15 of transistor 14. Emitters 11 and 15 of transistors 10 and 14 respectively are connected by means of a potential source 52 to power ground 23.

Collector 13 of transistor 10 is connected by means of a conductor 55, a resistor 56, a diode 57, a diode 58, a resistor 59, and a conductor 60 to the collector 17 of transistor 14. Collector 17 of transistor 14 is connected by means of conductor 60, a resistor 61, a diode 62, a diode 63, a resistor 64, and conductor 55 to collector 13 of transistor 10. A junction 66 between diodes 57 and 58 is connected by means of a resistor 67 in series with a resistor 68 to a junction 70 between diodes 62 and 63.

A first D.C. input signal 71 is connected across terminals 32 and 34. A second D.C. input signal is connected from a junction 73, between resistors 67 and 68, to a reference point 74. A pair of output terminals 76 and 77 are connected to terminals 66 and 70 respectively. Conductors 55 and 60 can be considered as connected across the terminals of one diagonal of a bridge and the output terminals 76 and 77 as connected across the other diagonal of the bridge.

*Operation of FIGURE 1*

In considering the operation of the circuit of FIGURE 1, assume that the input from signal source 71 is zero and that transistor 10 is just beginning to conduct.

When transistor 10 conducts current will flow from potential source 52 through the emitter 11 to collector 13 of transistor 10, resistor 21 and resistor 22 to the other side of potential source 52. This current flow through resistor 22 produces a volt drop across resistor 22 such that terminal 43 is positive with respect to ground terminal 23. This volt drop across resistor 22 will be coupled through conductor 44 to terminal 31 of transformer winding 30. When transistor 10 begins conducting the positive going voltage appearing at the collector of that transistor is transmitted to the base of transistor 14 and transistor 14 begins to cut off. As transistor 14 cuts off the voltage at junction 47 goes negative. The voltage at junction 47 is transmitted via conductor 46 to terminal 35 of transformer winding 33. Hence terminal 31 is positive with respect to terminal 32, and terminal 35 is negative with respect to terminal 34.

The volt drop across the primary windings 30 and 33 causes a magnetizing current to flow through these primaries which in turn induces a voltage into the secondary windings 36 and 40, the voltage in winding 36 being of such polarity that the terminal 38 is positive with respect to terminal 37 and the voltage in winding 40 being of such polarity that terminal 42 is positive with respect to terminal 41.

The voltage induced in secondary 36 causes a current flow from terminal 38 through the emitter 11 to base 12 of transistor 10 and resistor 50 to terminal 37 of secondary 36. This current flow further increases the conduction of transistor 10 through resistors 21 and 22. The voltage induced in transformer secondary winding 40 is of such polarity that the base 16 of transistor 14 is positive with respect to the emitter 15 and hence transistor 14 is in its "off" or non-conducting state.

It should be noted that while one path for the base current flow of transistor 10 is through resistor 50 and winding 36, a second path is from the battery 52 through emitter 11 through base 12, resistor 24, resistor 25, and resistor 26 to the other side of potential source 52 . The effect of this additional base current path will be explained more fully hereinafter.

The increase in conduction of transistor 10 increases the volt drop across resistor 22 and hence the transformer primary windings 30 and 33, until the voltage produced across the transformer primary windings drives the transformer core to saturation. At this point, the core is just coming out of negative saturation and proceeds up to positive saturation to accomplish the "on" period, after which the next switching point occurs. When the transformer core saturates, the voltage induced in the transformer secondary windings 36 and 40 will decrease to zero and the back E.M.F. will be generated by the collapsing fields around the secondary windings such that transistor 10 will be turned to its nonconducting or "off" state and transistor 14 will be turned to its conducting or "on" state. When transistor 14 begins to conduct, current will flow from potential source 52 through emitter 15 to collector 17 of transistor 14, resistor 25, and resistor 26 to the other side of potential source 52. This current flow will produce a volt drop across resistor 26 such that terminal 47 will be positive with respect to ground terminal 23. This volt drop across resistor 26 will be coupled through conductor 46 and resistor 22 and conductor 44 to the primary windings of transformer 27 such that terminal 35 will be positive with respect to terminal 34, and terminal 32 will be positive with respect to terminal 31.

The magnetizing current flow produced through transformer windings 33 and 30 due to the volt drop across resistor 26 induces a voltage into transformer secondary winding 40 such that terminal 41 will be positive with respect to terminal 42, and in transformer secondary 36 such that terminal 37 is positive with respect to terminal 38. The voltage induced in transformer secondary winding 36 is of a polarity such that base 12 is positive with respect to emitter 11 and hence transistor 10 will be cut off.

The voltage induced in transformer secondary winding 40 causes a current from terminal 41 through the emitter 15 to base 16 of transistor 14 and resistor 51 to terminal 42, increasing the conduction of transistor 14.

As explained hereinbefore with respect to transistor 10, there is an additional current flow path for the base current of transistor 14. This path is from the positive potential source 52 through the emitter 15 to base 16 of transistor 14, resistor 20, resistor 21 and resistor 22 to the other side of potential source 52.

The increase in current flow through resistor 20 will continue until transformer 27 is driven into saturation, at which time the secondary induced voltages will disappear and the back E.M.F. will be generated which will reverse the conductions of transistors 14 and 10 and will turn transistor 10 "on" and transistor 14 "off."

The output, measured between conductors 55 and 60, of the rectangular pulse generator when there is no signal from signal source 71 is shown in FIGURE 4A. It will be noted from FIGURE 4A that the periods of the positive and negative portions of the wave form are equal and that therefore the positive and negative time average of the wave form will be zero.

Assume now that a D.C. input signal appears at the output of signal source 71 such that terminal 32 is positive with respect to terminal 34.

When transistor 10 conducts, source 52 is effectively connected across primary windings 30 and 33 such that the negative terminal of source 52 is connected to terminal 35 of winding 33 and the positive terminal of source 52 is connected to terminal 31 of winding 30. Thus, source 52 acts as an energizing source for primary windings 30 and 33.

It can readily be seen that under these circumstances the control signal is of a polarity such that it "opposes" potential source 52.

Since the volt-time product of core 27 is a constant, when the energizing voltage decreases, the time required to saturate the core must increase. Since, as explained above, the control signal "opposes" potential source 52 the time required to saturate the core when transistor 10 conducts increases.

Assume that the control signal remains at the same polarity, that is, terminal 32 positive with respect to terminal 34. When transistor 14 conducts, source 52 will now be effectively connected across primary windings 30 and 33 such that terminal 35 of winding 33 is positive with respect to terminal 31 of winding 30. It can now be seen that the input signal from source 71 "aids" energizing source 52 and hence the energizing voltage will be increased. Since, as explained above, the volt-time product must remain a constant, the energizing voltage has increased so the time required to saturate the core must increase.

The effect of the input signal upon circuit operation can be seen by referring to FIGURE 3 which shows a plot of the constant volt-time product for the transformer core. When the input signal is zero the voltage applied to primary windings 30 and 33 will be approximately equal to source voltage 52. This voltage is represented by $E_s$ in FIGURE 3.

When $E_s$ is applied to the transformer windings 30 and 33 the conduction time of the positive and negative conduction periods will be equal to $t_2$.

However, when an input signal is applied to the transformer primaries as explained above, and assuming the polarity of source 71 such that terminal 32 is positive with respect to terminal 34, the input signal will subtract from the source in one case, when transistor 10 conducts, and will add to the signal source when transistor 14 conducts. This can be seen in FIGURE 3 wherein voltage $E_{s1}$ represents the voltage applied to the transformer primaries when transistor 10 conducts and $E_{s2}$ represents the voltage applied to the primaries when transistor 14 conducts. From FIGURE 3 it can be seen that when $E_{s2}$ is applied to the transformer primaries the time required to drive the core to saturation, that is, $t_1$, has decreased, while when $E_{s1}$ is applied to the transformer primaries the time required to drive the core to saturation, that is, $t_3$, has increased.

The output wave form when a control signal is applied to the circuit is shown in FIGURE 4B. FIGURE 4B shows that the period of the positive conduction period has decreased while the period of the negative conduction period has increased, the magnitude of positive and negative half cycles still being equal. Similarly, if the control signal is of the positive polarity such that terminal 34 is positive with respect to terminal 32, the control signal will "aid" potential source 52 when transistor 10 conducts and will oppose source 52 when transistor 14 conducts. In this case the output wave form is similar to that shown in FIGURE 4B except that the period of the negative conduction period is less than the period of the positive conduction period. Resistors 20 and 24, cross connected between the collector and bases of transistors 10 and 14, provide a feedback path to the transistors and increase the modulation ratio to approximately 100%. Without these feedback paths the practical modulation ratio of the pulse generator is substantially less than 100%. The operation without auxiliary feedback can be explained as follows: assume that resistors 20 and 24 are disconnected from the circuit; that transistor 10 is conducting and that a signal is present at the output of signal source 71 such that terminal 32 is positive with respect to terminal 34. The conduction of transistor 10 through resistor 22 causes terminal 31 of transformer primary winding 30 to become positive with respect to terminal 35 of transformer primary winding 33. Since the input signal from signal source 71 is making terminal 32 positive at the same time that the conduction of transistor 10 is making terminal 31 positive, it can be seen that as the magnitude of the input signal increases the voltage across primary winding 30 will decrease and hence the voltage induced in the secondary windings 36 and 40 will also decrease. As the magnitude of the input signal from signal source 71 is increased still further, eventually the point will be reached where the voltage induced in secondary winding 36 is no longer sufficient to maintain an emitter to base current flow in transistor 10 and transistor 10 will be "starved" out thereby resulting in erratic generator operation.

The operation with auxiliary feedback is as follows: assume now that resistors 20 and 24 are again connected into the circuit. Since transistor 14 is nonconducting, its collector 17 will be at substantially ground potential, and hence transistor 10 has an auxiliary base current path from potential source 52 through emitter 11 to base 12 of transistor 10, resistor 24, resistor 25 and resistor 26 to the other side of potential source 52. Therefore, as the magnitude of the input signal from signal source 71 increases, the decrease in the induced voltage in secondary winding 36 no longer results in an insufficient emitter to base current flow in transistor 10 and hence the modulation ratio is proportionately increased.

The conduction of transistor 10 causes conductor 55 to become positive with respect to conductor 60 and a current flows from source 52 through emitter 11 to collector 13 of transistor 10, conductor 55, resistor 56, diode 57, diode 58, resistor 59, conductor 60, resistor 25 and resistor 26 to the other side of potential source 52. Resistors 56 and 59 and diodes 57 and 58 are chosen so that when current flows through this branch of the diode bridge circuit, junction 66 is at the same potential as reference point 74.

Since when transistor 10 conducts conductor 55 becomes positive with respect to conductor 60, diodes 62 and 63 are backbiased and hence nonconductive. With diodes 62 and 63 nonconductive there will be no current flow through resistor 68 and therefore the output voltage appearing at output terminals 76 and 77 will be determined by the volt drop across resistor 67.

As explained previously, when diodes 57 and 58 conduct, junction 66 is at the same potential as reference point 74 and, in the absence of an input signal from signal source 75, the volt drop across resistor 67 is zero.

When transistor 14 conducts conductor 60 becomes positive with respect to conductor 55 and a current will flow from potential source 52 through emitter 15 to collector 17 of transistor 14, conductor 60, resistor 61, diode 62, diode 63, resistor 64, conductor 55, resistor 21 and resistor 22 to the other side of potential source 52. Resistors 61 and 64 and diodes 63 and 62 are chosen so that when diodes 62 and 63 conduct junction 70 is at the same potential as reference point 74. Since when transistor 14 conducts conductor 60 is positive with respect to conductor 55, diodes 57 and 58 will be backbiased and hence nonconductive. Therefore, the output voltage appearing across output terminals 76 and 77 will be determined by the current flow through resistor 68. Since when input signal source 75 is zero and diodes 62 and 63 conduct, terminals 70 and 74 are both at the same potential and therefore the volt drop across resistor 68 is zero.

As explained hereinbefore, when diodes 57 and 58, comprising a first branch of the bridge circuit, conduct, the potential at junction 66 is the same as reference point 74, and when diodes 62 and 63, comprising a second branch of the bridge circuit, conduct, the potential at junction 70 is the same as reference point 74.

It can be seen, therefore, that as long as the input signal from signal source 75 is zero the output voltage will also be zero, regardless of the magnitude of the input signal from signal source 71.

Assume now that a signal appears at the output of signal source 75 such that terminal 73 is positive with respect to reference point 74. When diodes 57 and 58 conduct a current will flow from terminal 73 through resistor 67, diode 58, resistor 59, conductor 60, resistor 25, resistor 26, and ground 23 to the reference point 74. This current flow through resistor 67 causes a volt drop across this resistor such that output terminal 77 is positive with respect to terminal 76.

When diodes 62 and 63 conduct a current will flow from terminal 73 through resistor 68, diode 63, resistor 64, conductor 55, resistor 21, resistor 22, and ground 23 to reference point 74. This current flow through resistor 68 causes a volt drop across this resistor such that output terminal 77 is negative with respect to output terminal 76.

As shown in FIGURE 1, the energization for transformer primaries 30 and 33 is taken from junction 43, between resistors 21 and 22, and junction 47, between resistors 25 and 26. Since only a portion of source 52 is used to energize the transformer primaries, the generator provides a voltage gain and the output on conductors 55 and 60 will be some multiple of the input signal from input signal source 71.

It can be seen from the above discussion that the magnitude of the output voltage at output terminals 76 and 77 is determined by the magnitude of the input signal from source 75, and that the period of the positive and negative portions of the output signal are determined by the magnitude of the input signal from source 71.

Since the output signal period is controlled by a first input signal and the output signal magnitude is controlled by a second input signal, the time volt area average of the output signal is proportional to the algebraic product of the two input signals. To explain further a simple example will be used, although the applicant does not wish to be limited in any way to the numbers used. Assume that the positive pulses are twice as long as the negative pulses and the amplitude of each is one volt, then the average output or direct voltage output is one-third volt. If the amplitude is doubled to 2 volts, the average output is two-thirds volt. If, on the other hand, the output is positive 3 times as long as it is negative, the average output will be one-half volt when the amplitude is one volt and the output will average to one volt when the pulse amplitude is 2 volts.

*Structure of FIGURE 2*

Referring to FIGURE 2, there is shown an alternating rectangular wave generator substantially the same as the generator shown in FIGURE 1. The equivalent components in the generator of FIGURE 2 have been labeled with the same numerals as their counterpart of FIGURE 1 except that a prime has been added. The generator of FIGURE 2 differs from that of FIGURE 1 in that resistors 21 and 25 in the collector circuits of transistors 10 and 14 respectively have been removed, and resistors 80 and 81 have been added to the emitter circuits of transistors 10 and 14 respectively.

Emitter 11′ of transistor 10′ is connected by means of a conductor 83 to a base 86 of a transistor 84. Transistor 84 further has an emitter 85 and a collector 87.

Emitter 15' of transistor 14' is connected by means of a conductor 90 to a base 93 of a transistor 91. Transistor 91 further has an emitter 92 and a collector 94. Emitter 85 of transistor 84 is directly connected to emitter 92 of transistor 91. Collector 87 of transistor 84 is connected by means of a resistor 95 in series with a resistor 96 to the collector 94 of transistor 91. A source of input signals 97 is connected from a junction 98 between resistors 95 and 96 to the emitters 85 and 92 of transistors 84 and 91 respectively. A junction 99 between resistors 80 and 81 is connected by means of a resistor 100 in series with a resistor 101 to ground 23'. A junction 102 between resistors 100 and 101 is connected to the emitters 85 and 92 of transistors 84 and 91 respectively.

*Operation of FIGURE 2*

The operation of the rectangular wave pulse generator of FIGURE 2 is substantially the same as that of FIGURE 1 and will not be repeated here. Referring to FIGURE 2 it can be seen that a current will flow from potential source 52' through resistor 100 and resistor 101 to ground 23'. The current flow through resistor 100 develops a voltage across this resistor which is coupled through resistors 80 and 81 to the bases 86, 93 of transistors 84, 91 respectively. The current flow through resistor 101 causes a voltage to be developed at junction 102 which is coupled to the emitters 85 and 92 of transistors 84 and 91 respectively. Hence the voltage developed across resistor 100 tends to bias transistors 84, 91 to their "off" or nonconducting state. However, when transistor 10' conducts the potential at its emitter 11' will drop and this drop in potential is coupled through conductor 83 to the base 86 of transistor 84 biasing transistor 84 to its "on" or conducting state. With transistor 84 biased "on" a current will flow from potential source 52 through resistor 100, emitter 85 to base 86 of transistor 84, conductor 83, emitter 11' to collector 13' of transistor 10', and resistor 22' to the other side of potential source 52.

With transistor 84 biased to its "on" state a current will also tend to flow in the emitter-collector circuit of transistor 84. However, if the input signal from signal source 97 is zero no current will flow through the emitter to collector circuit of transistor 84 and hence the output signal taken across resistors 95 and 96 will be zero.

If an input signal is present from signal source 97 such that terminal 102 is positive with respect to terminal 98 then when transistor 84 conducts a current will flow from terminal 102 through the emitter 85 to collector 87 of transistor 84 and resistor 95 to the other side of input signal source 97. This current flow through resistor 95 causes output terminal 103 to go positive with respect to output terminal 104.

When transistor 14' conducts the potential at its emitter 15' will drop, and this drop in potential will be coupled through conductor 90 to the base 93 of transistor 91 biasing transistor 91 to its "on" or conducting state. When transistor 91 conducts a current will flow from input signal source 97 through the emitter 92 to collector 94 of transistor 91 and resistor 96 to the other side of input signal source 97. This current flow through resistor 96 causes output terminal 103 to become negative with respect to terminal 104.

Transistors 84 and 91 are chosen so that they have an adequate beta characteristic so that when the polarity of the signal from input signal source 97 reverses current will flow from the collector to emitter of whichever transistor is biased to its conducting state.

It can be seen from the above discussion that the magnitude of the output signal developed across output terminals 103 and 104 is determined by the magnitude of the input signal from input signal source 97, and that the period of the positive and negative portions of the output signal are determined by the magnitude of the input signal from input signal source 71'.

As explained before in conjunction with FIGURE 1, since the period of the output signal is determined by the input signal from source 71' and the magnitude of the output signal is determined by the input signal from signal source 97, the volt-time average of the output signal across output terminals 103 and 104 is proportional to the product of the two input signals.

It is to be understood that while I have shown a specific embodiment of my invention, this is for the purpose of illustration only and that my invention is to be limited solely by the scope of the appended claims.

What is claimed is:

1. Apparatus of the class described comprising: a rectangular pulse generator, said pulse generator producing constant magnitude alternating polarity rectangular pulses, the period of said pulses being variable in response to a first input signal; first and second diodes serially connected across the output of said pulse generator, said first and second diodes both conducting when the output of said generator is of a first polarity; third and fourth diodes also serially connected across the output of said pulse generator, said third and fourth diodes both conducting when the output of said generator is of a second polarity; first and second impedances serially connected from a junction between said first and second diodes to a junction between said third and fourth diodes; output means connected across said first and second impedances; and means for connecting a second source of input signals to a junction between said first and second impedances.

2. Apparatus of the class described comprising: a rectangular pulse generator, said pulse generator producing constant magnitude alternating polarity rectangular pulses, the period of said pulses being variable in response to a first input signal; a diode bridge circuit having first and second diagonals and having first and second branches connected across the terminals of said first diagonal, intermediate points in said branches forming the second diagonal; means connecting the output of said pulse generator across the first diagonal of said bridge circuit, said first branch of said bridge conducting when the output of said pulse generator is of a first polarity and said second branch of said bridge conducting when the output of said pulse generator is of a second polarity; first and second impedance means serially connected across the second diagonal of said bridge circuit; and a second source of input signals connected to a junction between said first and second impedance means.

3. Apparatus of the class described for producing an output signal having positive and negative potential regions, the positive and negative regions each having a duration determined by the magnitude of a first input signal and a magnitude determined by the magnitude of a second input signal comprising: a first source of input signals first and second semiconductor means each having an output electrode, a control electrode and a common electrode; a magnetic core having first, second, third and fourth windings; means connecting said first and second windings in series with the first signal source between the output electrode of said first semiconductor means and the output electrode of said second semiconductor means; means connecting said third and fourth windings from the control electrode to the common electrode of said first and second semiconductor means respectively; first and second impedance means cross connected between the output and control electrodes of said first and second semiconductor means respectively; a source of energizing potential having a first terminal connected to a common conductor; means connecting a second terminal of said potential source to the common electrodes of said first and second semiconductor means; third and fourth impedance means connected from the output electrodes of said first and second semiconductor means respectively to said common conductor; third and fourth semiconductor means each having an input electrode, an output electrode and a control electrode; means connecting the control electrodes of said third and fourth semiconductor means to the common electrodes of said first and second semiconductor means respectively; a second source of input signals connected to the input electrodes of said third and fourth semiconductor means; and load means connected between the output electrodes of said third and fourth semiconductor means.

4. Apparatus of the class described for producing an output signal whose period is determined by the magnitude of a first input signal and whose magnitude is determined by the magnitude of a second input signal comprising: first and second current control means; first and second impedances; first and second current paths, each of said paths including one of said current control means and one of said impedances; a magnetic core having first, second and third windings wound in inductive relation thereto; means connecting said first winding in series across said first and second impedances; means connecting said second and third windings to said first and second current control means respectively to produce a first feedback whereby said first and second current control means are operated to establish periodically a current conducting condition in said first path and a nonconducting condition in said second path followed by a non-conducting condition in said first path and a conducting condition in said second path, means adapted to connect a first source of input signals in circuit with said first winding to vary the conducting and nonconducting time of said first and second current paths; third and fourth impedance means cross-connected between said first and second current control means to provide a second feedback to said control means; first and second gate means directly connected to said first and second current control means respectively, the conduction of said first and second current control means biasing the first and second gates into conduction and cutoff; second input signal means; and means connecting said second input signal in circuit with the conducting one of said first or second gates.

5. Apparatus of the class described for producing an output signal whose period is determined by the magnitude of a first input signal and whose magnitude is determined by the magnitude of a second input signal comprising: first and second current control means; first and second impedances; first and second current paths, each of said paths including one of said current control means and one of said impedances, a magnetic core having first, second, third and fourth windings wound in inductive relation thereto; means connecting said first and second windings in series across said first and second impedances; means connecting said third and fourth windings to said first and second current control means respectively to produce a first feedback whereby said first and second current control means are operated to establish periodically a current conducting condition in said first path and a nonconducting condition in said second path followed by a nonconducting condition in said first path and a conductng condition in said second path; means adapted to connect a first source of input signals in circuit with said first and second windings to vary the conducting and nonconducting time of said first and second current paths; third and fourth impedance means cross-connected between said first and second current control means to provide a second feedback to said control means; a diode bridge circuit; means connecting a first diagonal of said bridge circuit across said first and second current control means so that one branch of said bridge conducts when said first current control means conducts and another branch of said bridge conducts when said second current control means conducts; fifth and sixth impedance means serially connected across a second diagonal of said bridge circuit; and a second source of input signals connected to a junction between said fifth and sixth impedance means.

References Cited by the Examiner

UNITED STATES PATENTS

| | | | |
|---|---|---|---|
| 2,891,726 | 6/59 | Decker et al. | 332—9 |
| 2,947,950 | 8/60 | Pinckaers | 332—9 |
| 2,962,602 | 11/60 | Decker et al. | 332—9 |
| 2,995,305 | 8/61 | Schmid | 235—194 |
| 3,017,109 | 1/62 | Briggs | 235—194 |
| 3,018,966 | 1/62 | Zelina | 235—195 |

MALCOLM A. MORRISON, *Primary Examiner.*

DARYL W. COOK, *Examiner.*